US010790274B2

(12) United States Patent
 Su et al.

(10) Patent No.: US 10,790,274 B2
(45) Date of Patent: *Sep. 29, 2020

(54) SCRS WITH CHECKER BOARD LAYOUTS

(71) Applicant: Taiwan Semiconductor Manufacturing Company, Ltd., Hsinchu (TW)

(72) Inventors: Yu-Ti Su, Tainan (TW); Wun-Jie Lin, Hsinchu (TW); Han-Jen Yang, Taipei (TW); Shui-Ming Cheng, Zhubei (TW); Ming-Hsiang Song, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 237 days.

This patent is subject to a terminal disclaimer.

(21) Appl. No.: 15/787,992

(22) Filed: Oct. 19, 2017

(65) Prior Publication Data

US 2018/0040603 A1   Feb. 8, 2018

Related U.S. Application Data

(63) Continuation of application No. 14/844,272, filed on Sep. 3, 2015, now Pat. No. 9,812,436, which is a
(Continued)

(51) Int. Cl.
 *H01L 27/02* (2006.01)
 *H01L 27/06* (2006.01)
(Continued)

(52) U.S. Cl.
 CPC ...... *H01L 27/0248* (2013.01); *H01L 27/0262* (2013.01); *H01L 27/0629* (2013.01);
(Continued)

(58) Field of Classification Search
 CPC ............. H01L 27/0248; H01L 27/0262; H01L 27/0629; H01L 27/0647; H01L 27/0814; H01L 29/7436
 See application file for complete search history.

(56) References Cited

U.S. PATENT DOCUMENTS 6,521,952 B1   2/2003  Ker et al.
9,147,676 B2   9/2015  Su et al.
(Continued)

OTHER PUBLICATIONS

Morishita, Y. et al.: "An Investigation of Input Protection for CDM Robustness in 40nm CMOS Technology," 2009 31st EOS/ESD Symposium, Aug. 30-Sep. 4, 2009, pp. 1-6, Anaheim, CA.

*Primary Examiner* — Timor Karimy
(74) *Attorney, Agent, or Firm* — Slater Matsil, LLP

(57) ABSTRACT

An Electro-Static Discharge (ESD) protection circuit includes a plurality of groups of p-type heavily doped semiconductor strips (p+ strips) and a plurality of groups of n-type heavily doped semiconductor strips (n+ strips) forming an array having a plurality of rows and columns. In each of the rows and the columns, the plurality of groups of p+ strips and the plurality of groups of n+ strips are allocated in an alternating layout. The ESD protection circuit further includes a plurality of gate stacks, each including a first edge aligned to an edge of a group in the plurality of groups of p+ strips, and a second edge aligned to an edge of a group in the plurality of groups of n+ strips.

20 Claims, 13 Drawing Sheets

Related U.S. Application Data continuation of application No. 14/044,601, filed on Oct. 2, 2013, now Pat. No. 9,147,676.

(51) Int. Cl.
  *H01L 29/74* (2006.01)
  *H01L 27/08* (2006.01)

(52) U.S. Cl.
  CPC ...... *H01L 27/0647* (2013.01); *H01L 27/0814* (2013.01); *H01L 29/7436* (2013.01)

(56) References Cited

U.S. PATENT DOCUMENTS

| | | |
|---|---|---|
| 2006/0164130 A1 | 7/2006 | Yoshida |
| 2012/0319164 A1 | 12/2012 | Inaba |
| 2015/0091054 A1 | 4/2015 | Su et al. |
| 2015/0380396 A1 | 12/2015 | Su et al. |
| 2017/0098645 A1 | 4/2017 | Su et al. |

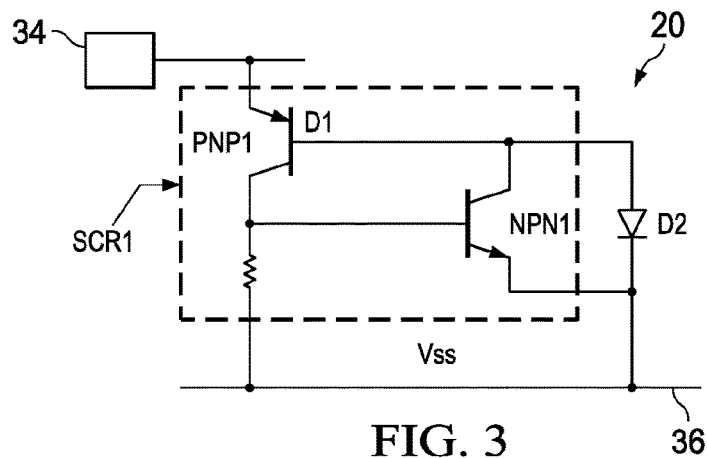
FIG. 3
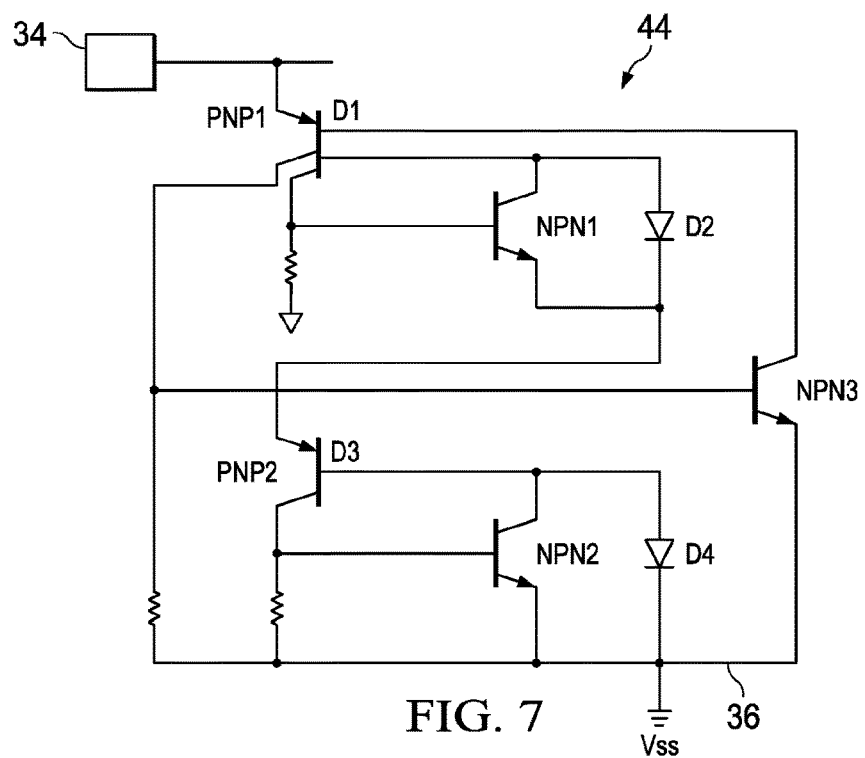
FIG. 7
| DIODE NUMBER | VOLTAGE |
|---|---|
| 2-3 | 0.9V |
| 3-4 | 1.8V |
| 5-7 | 2.5V |
| 8-10 | 3.3V |
| 10-12 | 5V |
FIG. 13

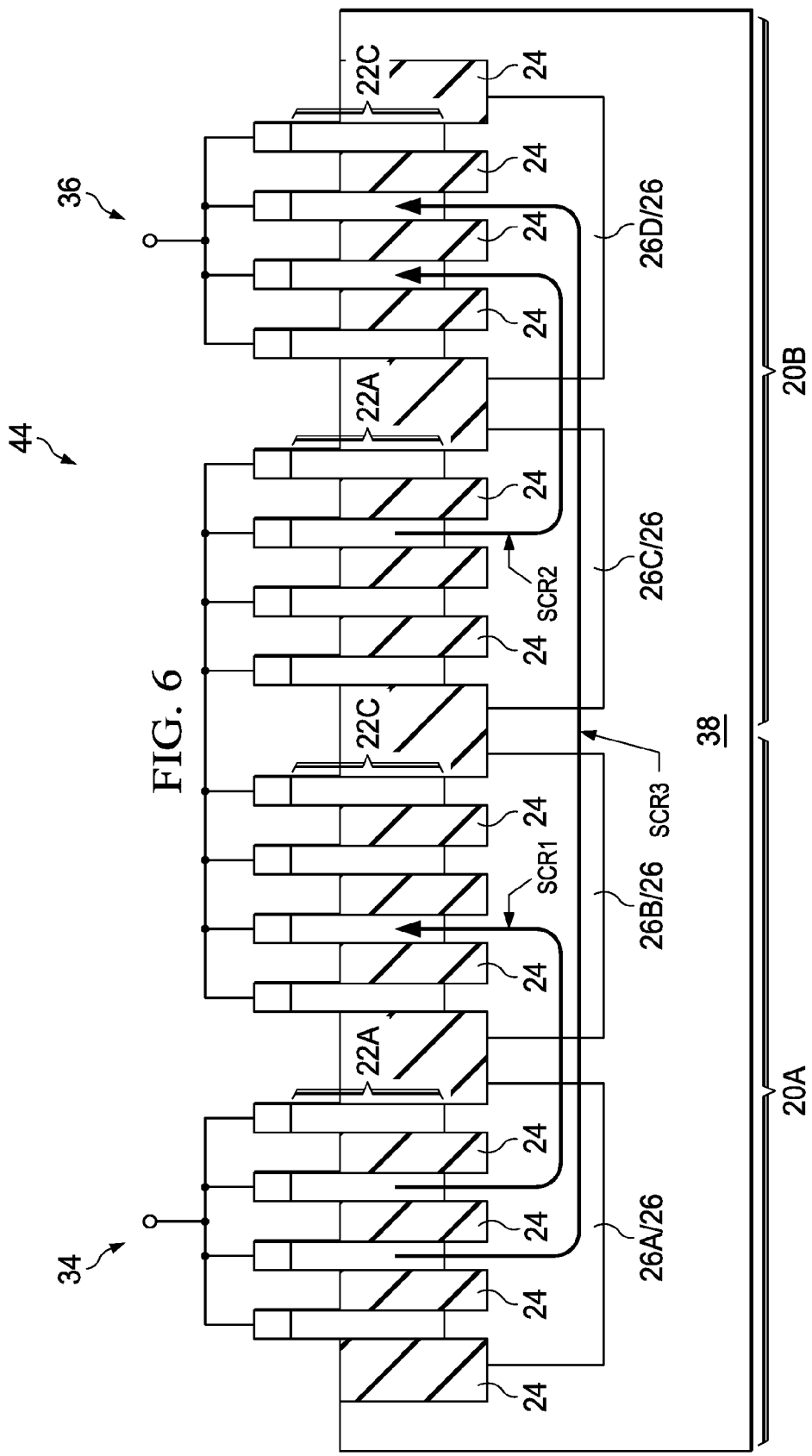

SCRS WITH CHECKER BOARD LAYOUTS

This application is a continuation of U.S. patent application Ser. No. 14/844,272, filed Sep. 3, 2015, entitled "SCRs with Checker Board Layouts," now U.S. Pat. No. 9,812,436, which is a continuation of U.S. patent application Ser. No. 14/044,601, filed Oct. 2, 2013, entitled "SCRs with Checker Board Layouts," now U.S. Pat. No. 9,147,676, which applications are hereby incorporated herein by reference in its entirety.

BACKGROUND

Silicon-Controlled Rectifier (SCR) devices have excellent Electro-Static Discharge (ESD) immunity and are good candidates for low-capacitance applications, which include Radio Frequency (RF) and high speed devices. SCRs, however, have low turn-on speed and high trigger voltages, and hence are not suitable for operations that need high turn-on speed and low trigger voltages.

BRIEF DESCRIPTION OF THE DRAWINGS

For a more complete understanding of the embodiments, and the advantages thereof, reference is now made to the following descriptions taken in conjunction with the accompanying drawings, in which:

FIG. 3 illustrates a circuit diagram of the SCR/diode-string unit in FIG. 2;

FIG. 6 illustrates a cross-sectional view of the SCR/diode-string combo unit in FIG. 5A;

FIG. 7 illustrates a circuit diagram of the SCR/diode-string combo unit in FIG. 5A;

FIG. 13 illustrates a table showing the relationship between the holding voltages of SCR/diode-string units and the number of diodes in the diode string of the respective SCR/diode-string units.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Electro-Static Discharge (ESD) protection devices comprising Silicon-Controlled Rectifiers (SCR) and diode strings are provided in accordance with various exemplary embodiments. The variations of the ESD protection devices in accordance with some embodiments are discussed. Throughout the various views and illustrative embodiments, like reference numbers are used to designate like elements.

Figure 1:
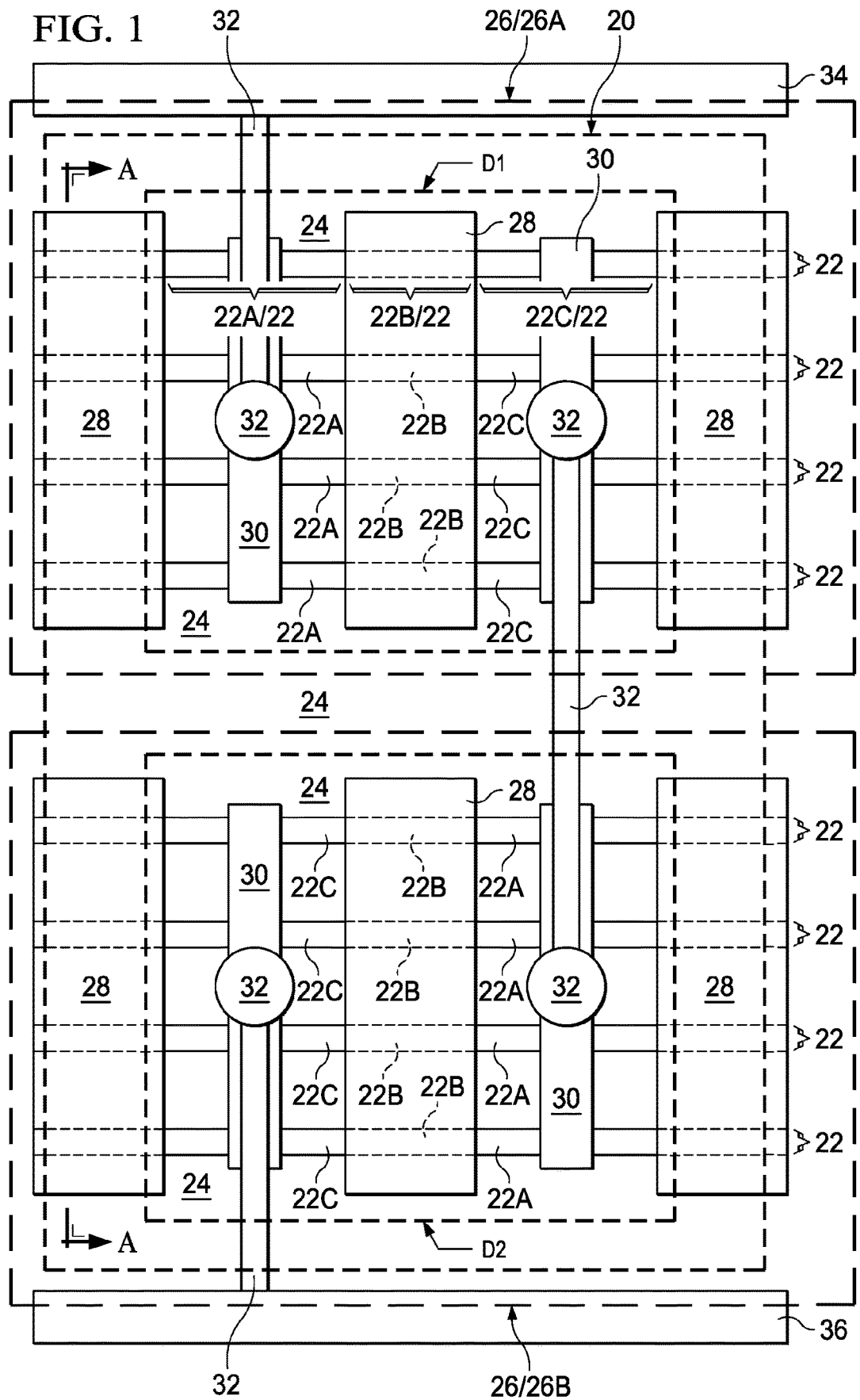
FIG. 1 illustrates a top view of a Silicon-Controlled Rectifier (SCR) and diode string unit (referred to as SCR/diode-string unit hereinafter) in accordance with some exemplary embodiments, wherein two diodes are connected serially to form the diode string.
Figure 2:
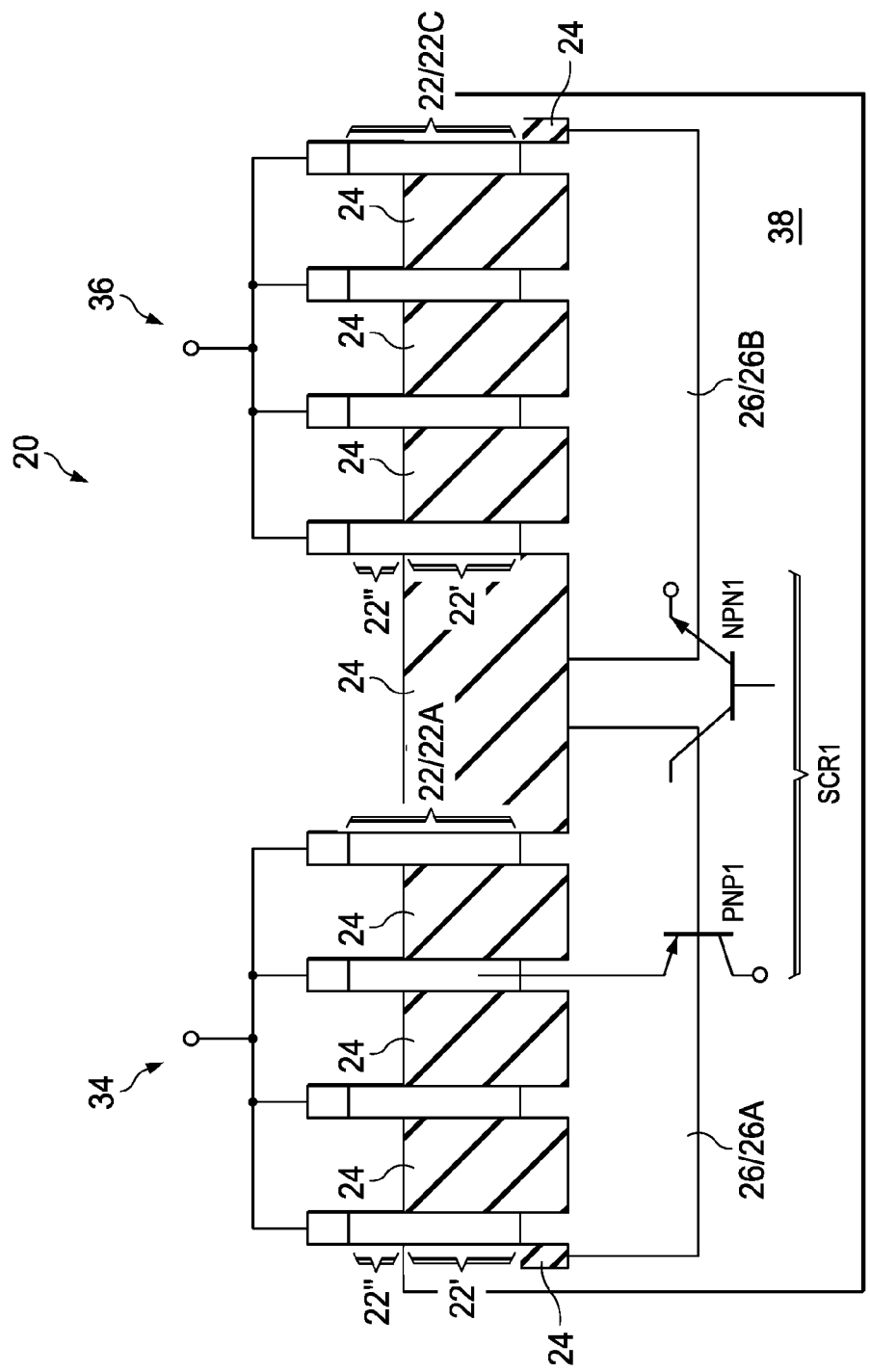
FIG. 2 illustrates a cross-sectional view of the SCR/diode-string unit in accordance with some exemplary embodiments.

FIG. 1 illustrates a top view of a unit (referred to as an SCR/diode-string unit hereinafter) that includes an SCR and a diode string therein. SCR/diode-string unit 20 includes a plurality of semiconductor strips 22, which are surrounded by Shallow Trench Isolation (STI) region(s) 24. Referring to FIG. 2, semiconductor strips 22 include portions 22' between STI regions 24, and may, or may not, include semiconductor fins 22" that are over the top surfaces of STI regions 24.

Referring back to FIG. 1, the plurality of semiconductor strips 22 has lengthwise directions parallel to each other. The neighboring semiconductor strips 22 may have a uniform pitch. A plurality of gate stacks 28 are formed over semiconductor strips 22, and may be formed to contact the sidewalls and the top surfaces of semiconductor strips 22. Each of gate stacks 28 includes a gate dielectric layer and a gate electrode (not shown).

Well regions 26 (including 26A and 26B) are formed, and portions 22B of semiconductor strips 22, which portions 22B are covered by gate stacks 28, may also be portions of well regions 26. In some embodiments, well regions 26 are n-well regions, which may have an n-type impurity concentration between about $1E14/cm^3$ and about $1E17/cm^3$, for example. Accordingly, the portions 22B of semiconductor strips 22 are of n-type. Semiconductor strips 22 include heavily doped p-type (p+) regions 22A and heavily doped n-type (n+) regions 22C, which have a p-type impurity concentration and an n-type impurity concentration, respectively, between about $1E19/cm^3$ and about $5E21/cm^3$, for example.

Semiconductor strips 22 form diodes D1 and D2. Each of diodes D1 and D2 has p-type semiconductor strip portions 22A as the anode, and n-type semiconductor strip portions 22B and 22C as the cathode. The anode and the cathode of diode D1 is on the top left part and top right part of SCR/diode-string unit 20. The anode and the cathode of diode D2 is on the bottom right part and bottom left part of SCR/diode-string unit 20. Accordingly, the p+ regions 22A and n+ regions 22C are allocated in a checker board pattern, wherein the checker board pattern have black and white patterns allocated in an alternating layout in each row and each column of a checker board.

Metal connections 30, which may be contact plugs, are formed for interconnection. Through metal connections 30, all semiconductor strips 22A in diode D1 are interconnected. All semiconductor strips 22C in diode D1 are interconnected. All semiconductor strips 22A in diode D2 are interconnected. All semiconductor strips 22C in diode D2 are interconnected. Furthermore, semiconductor strips 22C of diode D1 is connected to semiconductor strips 22A in diode D2, for example, through metal connections (such as metal lines, vias, and contact plugs) 32. Accordingly, diodes D1 and D2 form a diode string. The anode 22A of diode D1 may be connected to input/output pad 34 through metal connections 32. The cathode 22C of diode D2 may be connected to Vss node 36 through metal connections 32, which may be an electrical ground. Diodes D1 and D2 are biased in the same direction, with the cathode of each of diodes D1 and D2 closer to Vss node 36 than the respective anode of the same diode.

FIG. 2 illustrates a cross-sectional view of the structure shown in FIG. 1, wherein the cross-sectional view is obtained from the plane containing A-A in FIG. 1. In some embodiments, substrate 38 is a p-type substrate (p-sub). Accordingly, the structure in FIG. 2 form PNP bipolar transistor PNP1 and NPN bipolar transistor NPN1. Bipolar transistor PNP1 includes p+ strips 22A as the emitter, n-well region 26A as the base, and p-sub 38 as the collector. Bipolar transistor NPN1 has n+ strips 22C and n-well region 26B as the emitter, p-sub 38 as the base, and n-well region 26A as the collector. Bipolar transistors PNP1 and NPN1 in combination form an SCR, which is referred to as SCR1 hereinafter.

FIG. 3 illustrates the circuit diagram of SCR/diode-string unit 20, wherein diodes D1 and D2 and bipolar transistors PNP1 and NPN1 are illustrated. The SCR1 is triggered by the currents of diode string D1 and D2. SCR/diode-string unit 20 has a high ESD discharging ability due to the high ESD discharging ability of SCR1. On the other hand, diodes D1 and D2 are also coupled between pad 34 and Vss node 36. Accordingly, SCR/diode-string unit 20 has a high turn-on speed due to the high turn-on speed of diodes D1 and D2. The high turn-on speed is advantageous for the ESD protection in Charge Device Mode (CDM).

Figure 4:
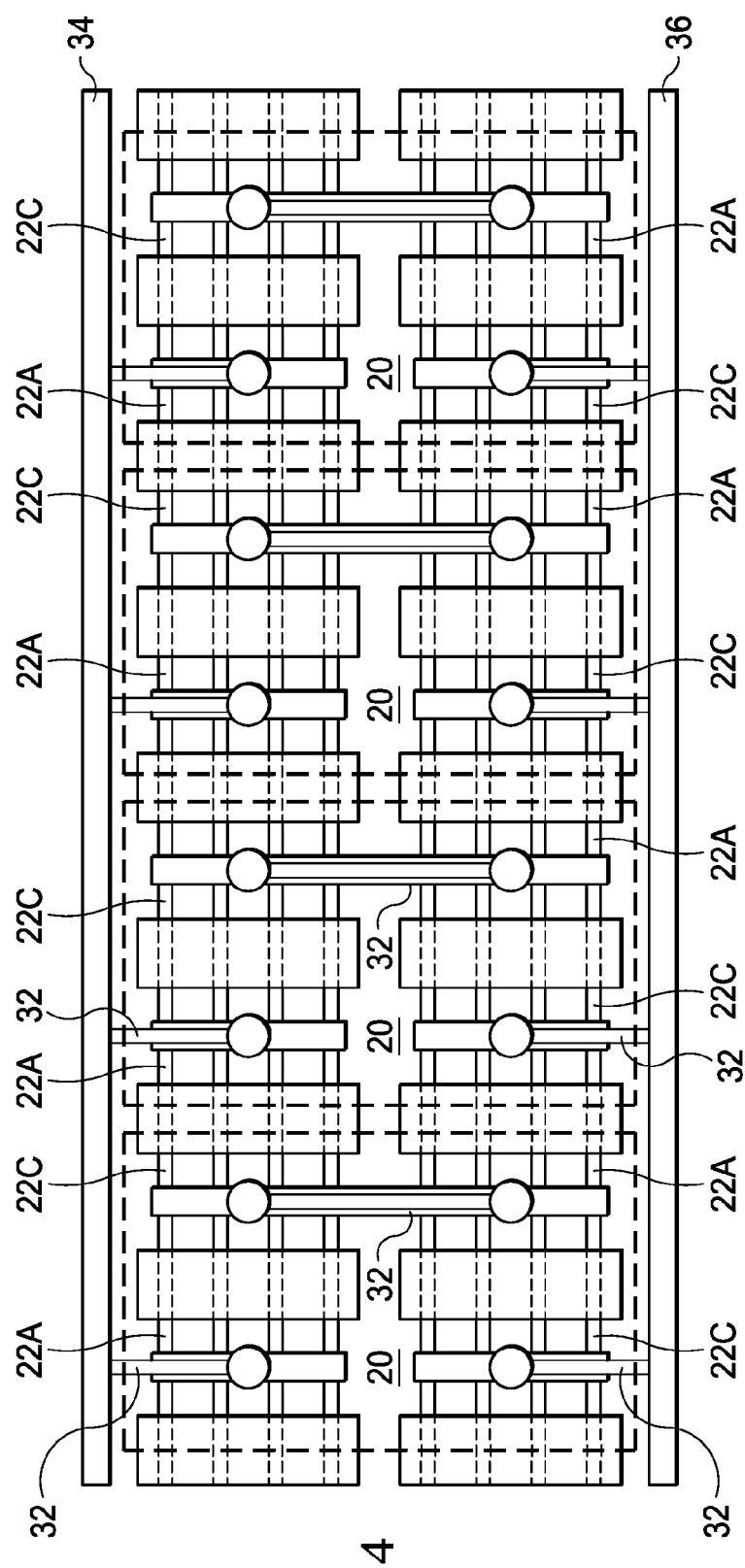
FIG. 4 illustrates a top view of a plurality of SCR/diode-string units connected in parallel.

FIG. 4 illustrates a top view of an ESD protection device, which includes a plurality of SCR/diode-string units 20 connected in parallel. Each of SCR/diode-string units 20 is connected to pad 34 and Vss node 36. The p+ regions 22A and n+ regions 22C are allocated in a checker board pattern. These embodiments have good ESD discharging ability since the ESD discharging current is multiplied. On the other hand, since the diode string in each of SCR/diode-string units 20 is coupled between pad 34 and Vss node 36, the turn-on speed is high.

Figure 5A:
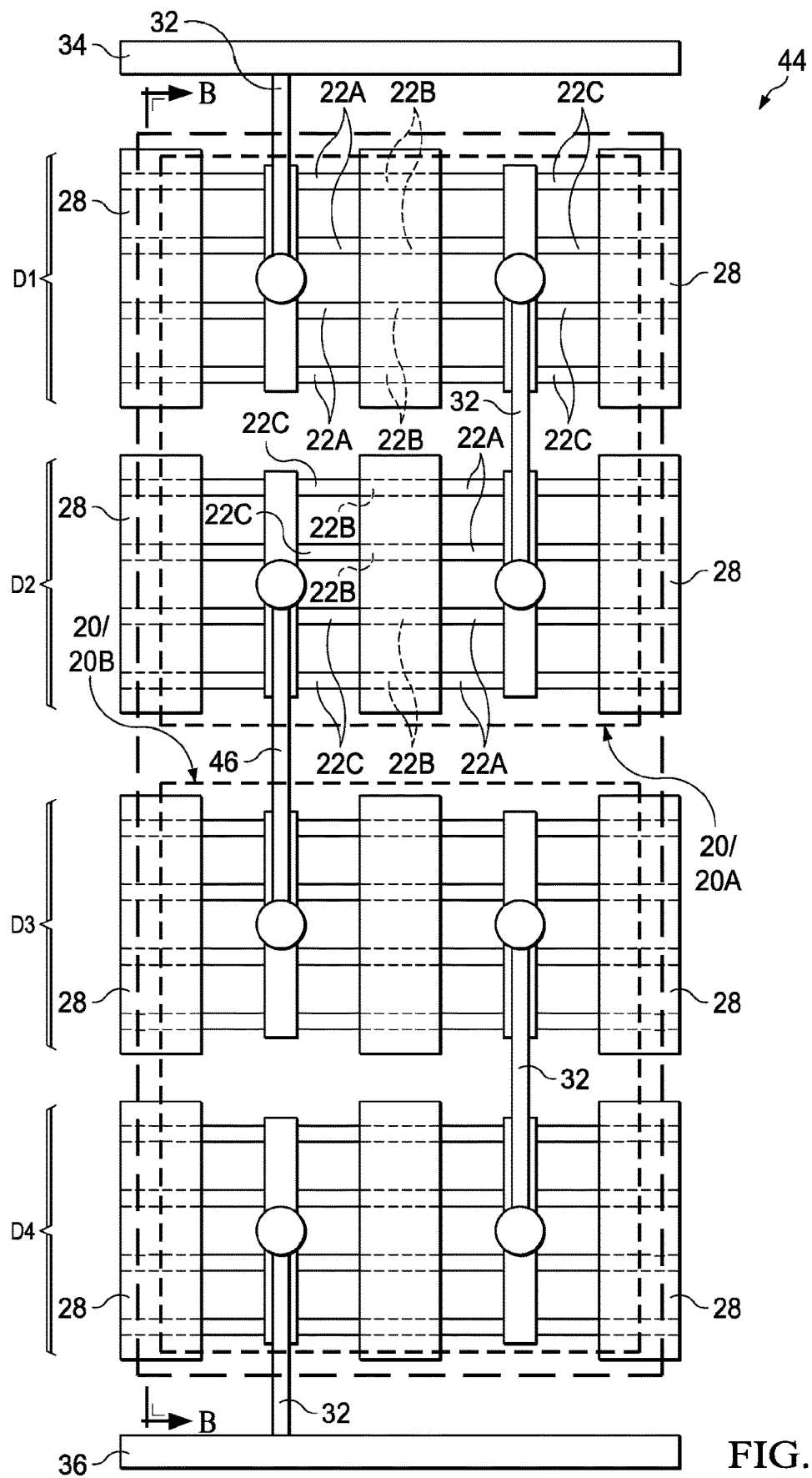
FIG. 5A illustrates a top view of an SCR/diode-string combo unit in accordance with alternative embodiments, wherein four diodes are connected in series to form a diode string.

FIG. 5A illustrates SCR/diode-string combo unit 44, which includes two SCR/diode-string units 20 (including 20A and 20B having an identical structure) cascaded between input/output pad 34 and Vss node 36. The p+ regions 22A and n+ regions 22C (refer to FIG. 1) in these embodiments are also allocated in a checker board pattern. In these embodiments, metal connection 46 is formed to connect the cathode of diode D2 in SCR/diode-string unit 20A to the anode of diode D3 in SCR/diode-string unit 20B. Accordingly, SCR/diode-string unit 44 includes a diode string including four diodes D1, D2, D3, and D4 biased in the same direction. With the diode string including four diodes, the holding voltage of SCR/diode-string combo unit 44 is increased over the holding voltage of a single SCR/diode-string unit 20.

Figure 5B:
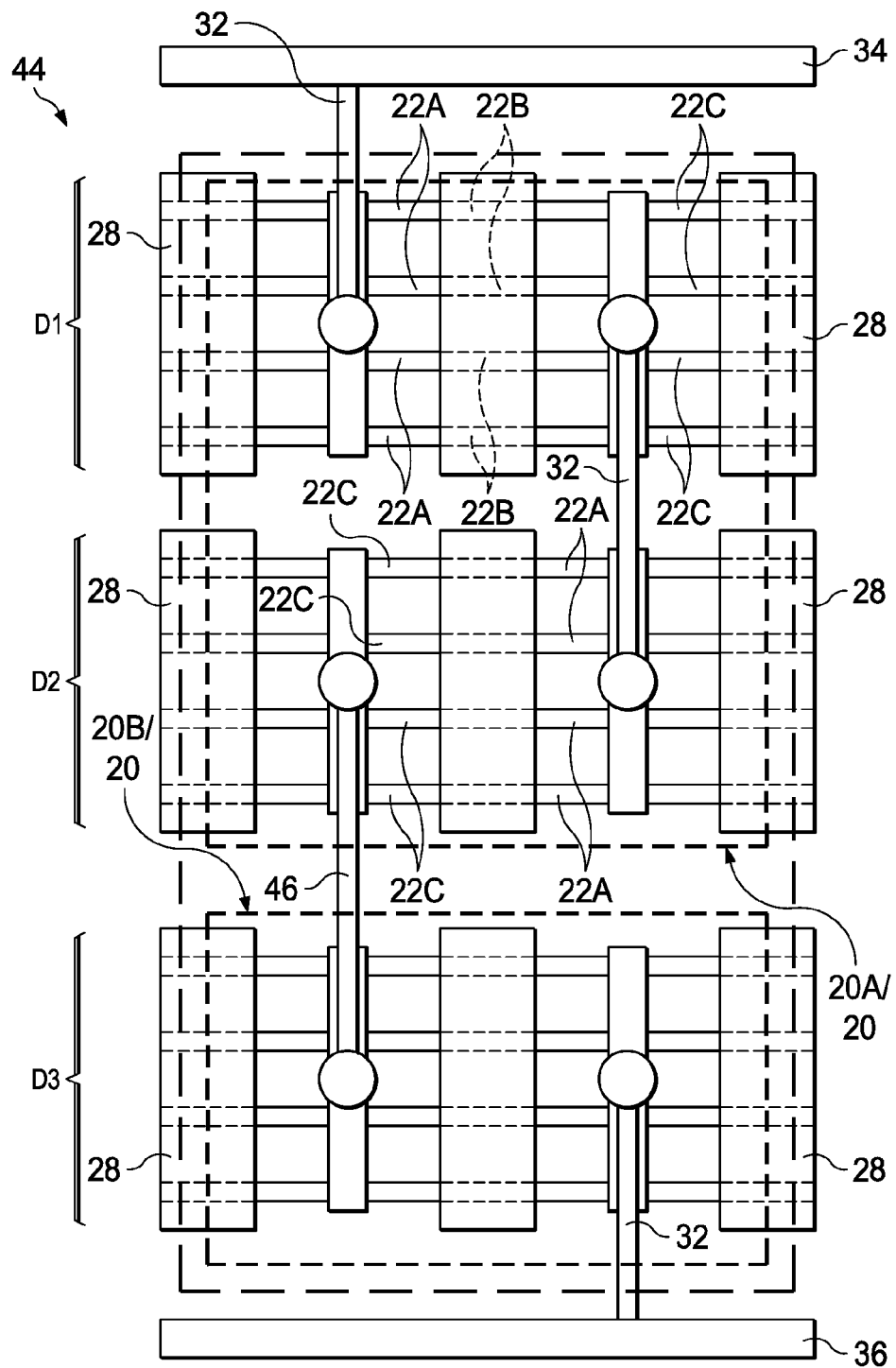
FIG. 5B illustrates a top view of an SCR/diode-string combo unit in accordance with alternative embodiments, wherein three diodes are connected in series to form a diode string.

FIG. 5B illustrates SCR/diode-string combo unit 44 in accordance with alternative embodiments. These embodiments are similar to the embodiments in FIG. 5A, except that there are three diodes D1, D2, and D3 (rather than four diodes) forming the respective diode string.

In alternative embodiments, more (such as 3, 4, 5, and 6) SCR/diode-string units 20 may be cascaded to form a SCR/diode-string combo unit. As can be found from FIGS. 1 and 5, the holding voltage of the SCR/diode-string combo units in accordance with the exemplary embodiments may be adjusted by changing the number of cascaded SCR/diode-string units 20. FIG. 13 illustrates the holding voltages of the SCR/diode-string combo units as a function of the number of cascaded SCR/diode-string units 20 (FIG. 1). For example, when SCR/diode-string unit 20 has two to three diodes, as shown in FIG. 1, the holding voltage may be about 0.9 volts. The SCR/diode-string combo unit 44 as shown in FIG. 5A, which includes two SCR/diode-string units 20, and hence four diodes, serially connected, has a holding voltage of 1.8 volts. Three serially connected diodes may also have the holding voltage of 1.8 Volts. When the number of cascaded SCR/diode-string units 20 increases to 4~5 or 5~6, which correspond to 8~10 or 10~12 serially connected diodes, respectively, the holding voltage may increase to about 3.3 volts and about 5 volts, respectively.

FIG. 6 illustrates a cross-sectional view of the structure shown in FIG. 5A, wherein the cross-sectional view is obtained from the plane containing line B-B in FIG. 5A. As shown in FIG. 6, three SCRs are formed. SCR1 is the SCR formed by SCR/diode-string unit 20A. SCR1 includes n-well regions 26A and 26B, and the overlying p+ portions 22A and n+ portions 22C. SCR2 is the SCR formed by SCR/diode-string unit 20B. SCR2 includes n-well regions 26C and 26D, and the overlying p+ portions 22A and n+ portions 22C. SCR3 includes n-well regions 26A and 26D, and the overlying p+ portions 22A and n+ portions 22C. The details of each of SCR1, SCR2, and SCR3 may be found referring to the discussion of FIG. 2.

FIG. 7 illustrates a circuit diagram of SCR/diode-string combo unit 44, wherein transistors PNP1 and NPN1 form SCR1 (FIG. 6), transistors PNP2 and NPN2 form SCR2 (FIG. 6), and transistors PNP1 and NPN3 form SCR3 (FIG. 6). Diodes D1, D2, D3, and D4 are serially connected between pad 34 and Vss node 36. The SCRs SCR1, SCR2, and SCR3 are triggered by the currents of the diode string D1, D2, D3, and D4. Similarly, SCR/diode-string combo unit 44 has a high turn-on speed due to the high turn-on speed of diodes D1, D2, D3, and D4.

Figure 8A:
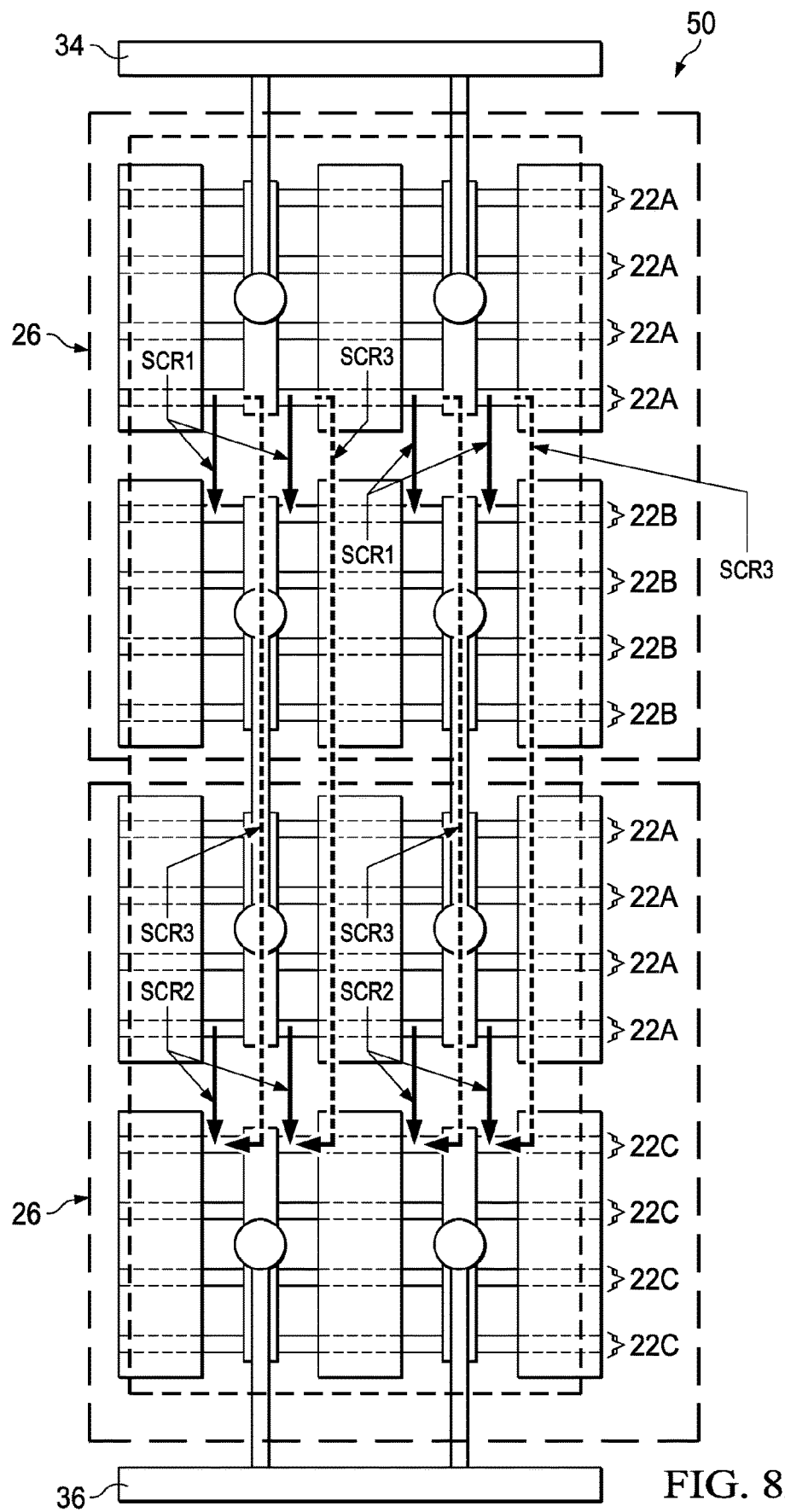
FIG. 8A illustrates a top view of a diode-string-free SCR unit in accordance with some embodiments.

FIG. 8A illustrates a diode-string-free SCR unit 50 in accordance with some embodiments. Diode-string-free SCR unit 50 includes SCRs that are connected between nodes 34 and 36, and does not include any diode string that are connected directly from node 34 to node 36, with all diodes in the diode string biased in the same direction. In these embodiments, each of semiconductor strips 22 in diode-string-free SCR unit 50 is doped to a same conductivity type, with semiconductor strips 22A being of p-type, and semiconductor strips 22C being of n-type. Therefore, the portions of the same semiconductor strip 22 on the opposite sides of gate stacks 28 are of the same conductivity type, and hence do not form a diode.

In FIG. 8A, SCRs SCR1, SCR2, and SCR3 are marked, wherein each of the SCRs SCR1, SCR2, and SCR3 is formed of a p+ strip, an n+ strip, the underlying n-well regions 26, and the p-sub 38 underlying n-well regions 26. Accordingly, diode-string-free SCR unit 50 has a similar ability for conducting high ESD currents as SCR/diode-string combo units 44 (FIGS. 5 through 7).

Figure 8B:
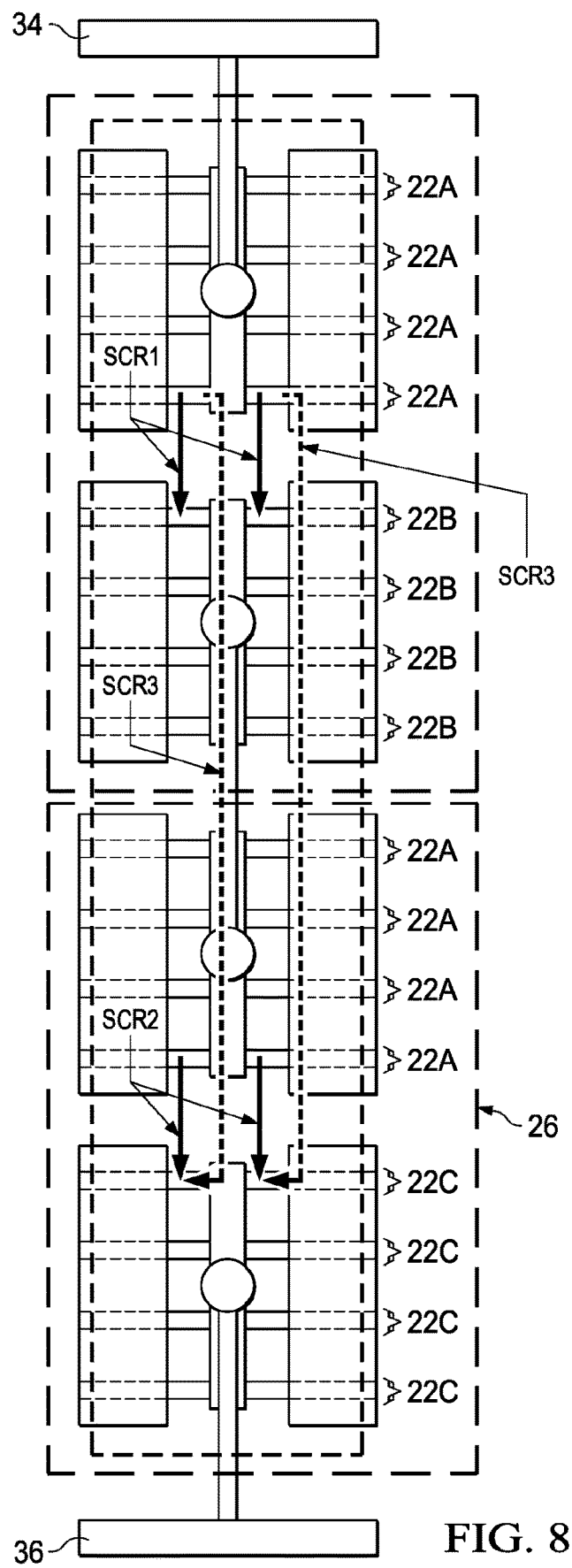
FIG. 8B illustrates a top view of a diode-string-free SCR unit in accordance with some embodiments, wherein the diode-string-free SCR unit includes a half of the diode-string-free SCR unit shown in FIG. 8A.
Figure 9:
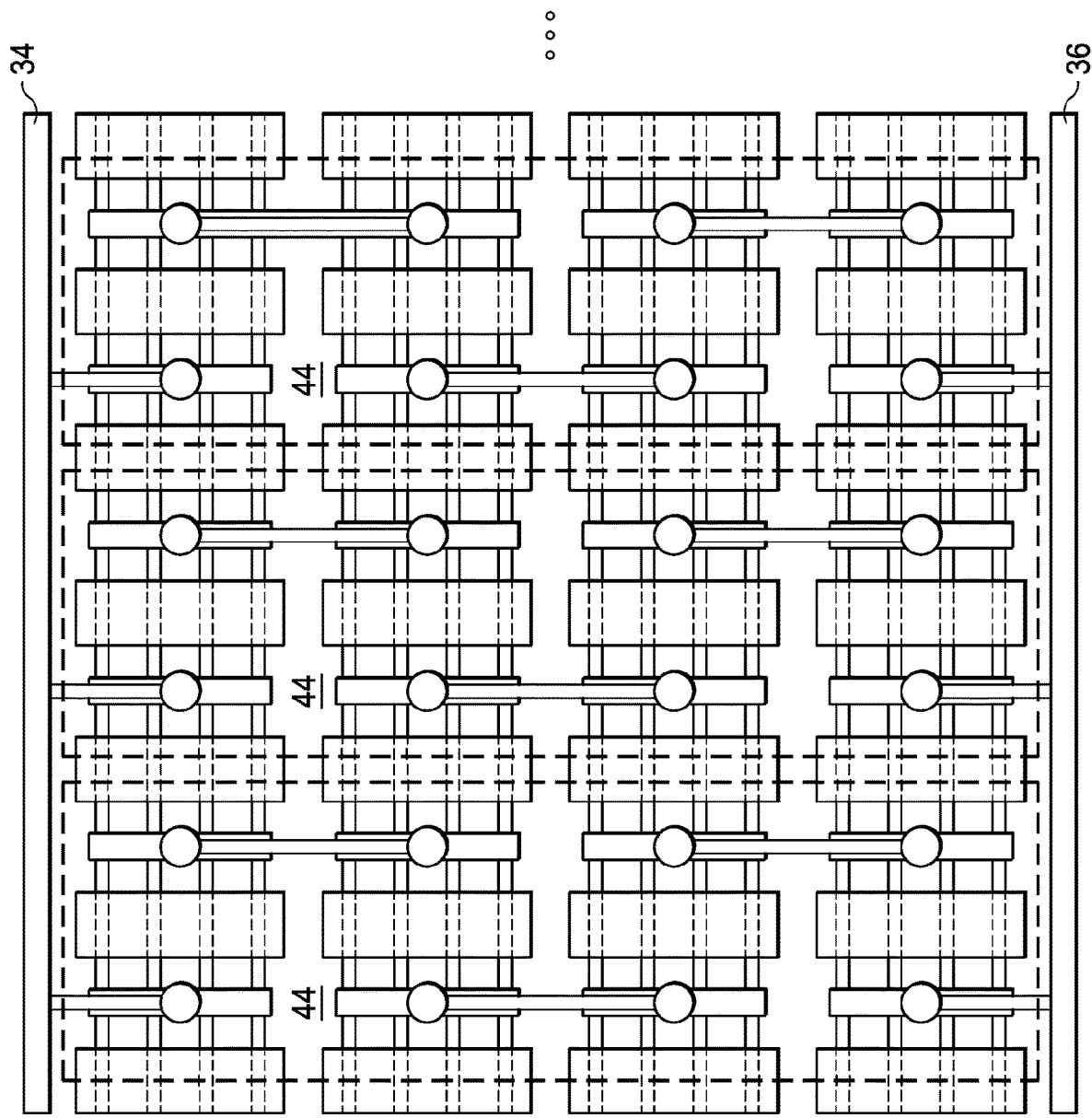
FIG. 9 illustrates an Electro-Static Discharge (ESD) device including a plurality of SCR/diode-string units connected in parallel.
Figure 10:
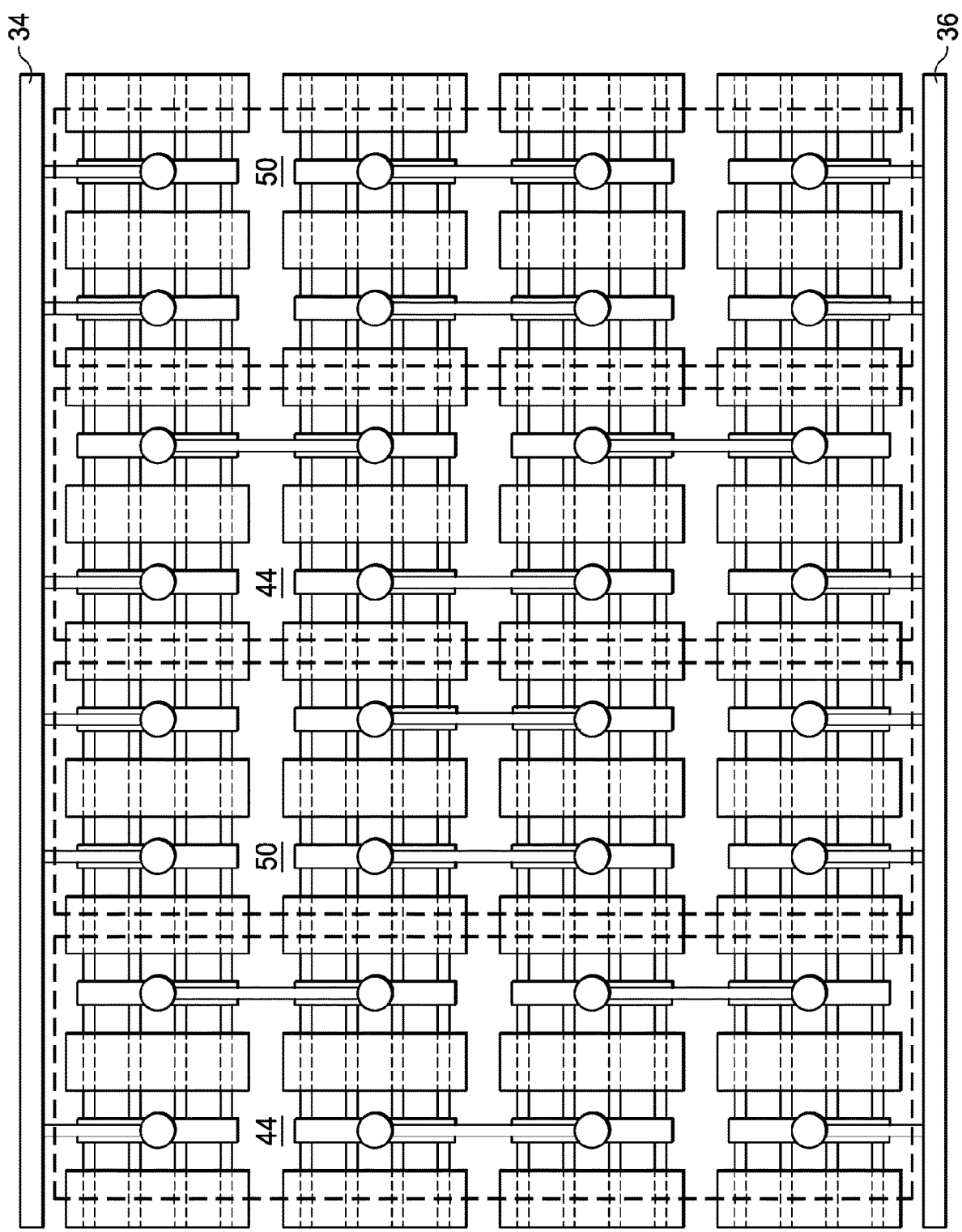
FIG. 10 illustrates an ESD device including SCR/diode-string unit(s) and diode-string-free SCR units, wherein a ratio of the number of SCR/diode-string unit(s) to the number of diode-string-free SCR units is equal to 1:1.
Figure 11:
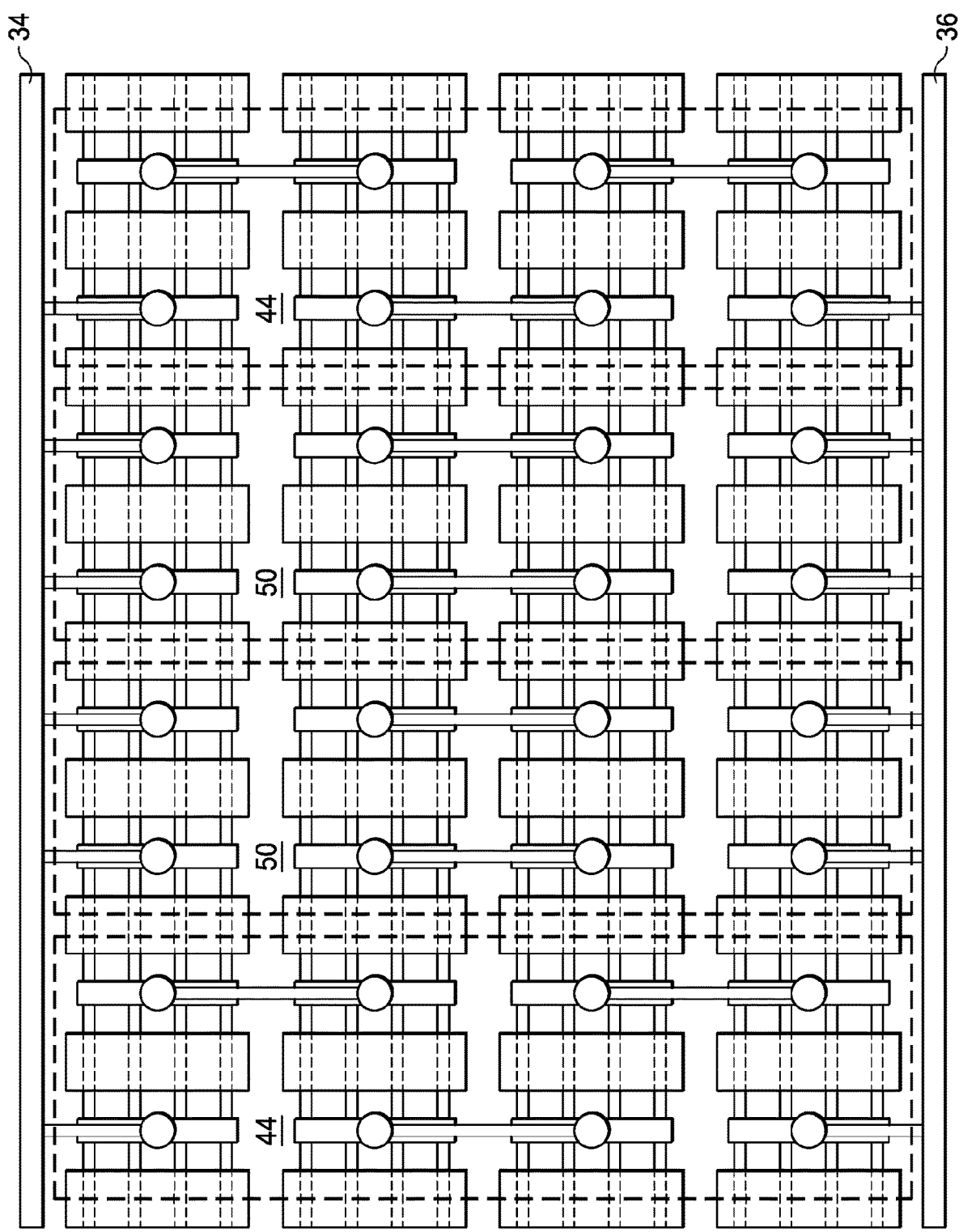
FIG. 11 illustrates an ESD device including SCR/diode-string unit(s) and diode-string-free SCR units, wherein a ratio of the number of SCR/diode-string unit(s) to the number of diode-string-free SCR units is equal to 1:2.
Figure 12:
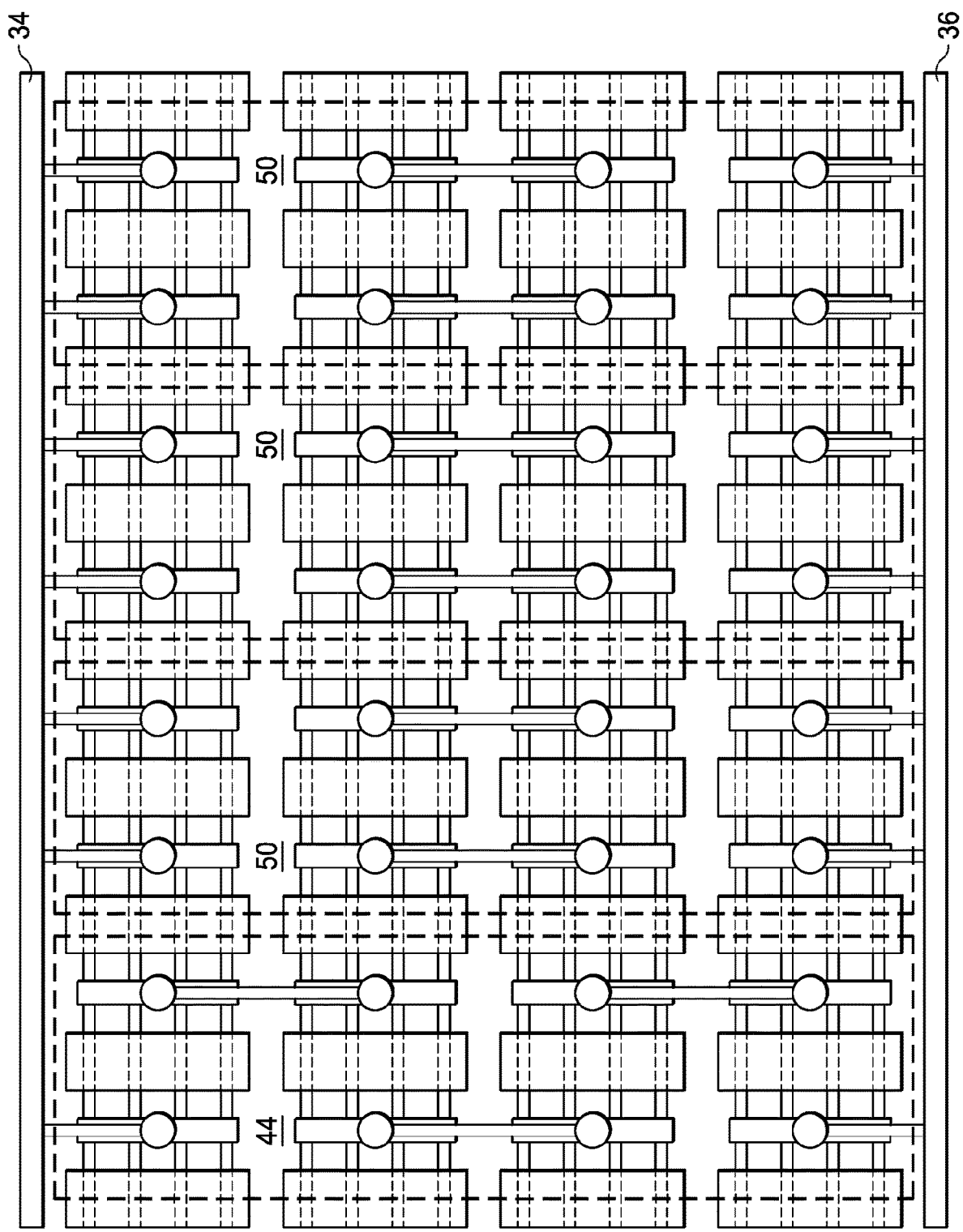
FIG. 12 illustrates an ESD device including SCR/diode-string unit(s) and diode-string-free SCR units, wherein a ratio of the number of SCR/diode-string unit(s) to the number of diode-string-free SCR units is equal to 1:3.

FIG. 8B illustrates diode-string-free SCR unit 50 in accordance with alternative embodiments. These embodiments are similar to the embodiments in FIG. 8A, except that the diode-string-free SCR unit 50 in these embodiments includes a half (the left half or the right half) of the diode-string-free SCR unit 50 in FIG. 8A. Alternatively stated, the diode-string-free SCR unit 50 in FIG. 8A may be assembled by placing two of the diode-string-free SCR unit 50 in FIG. 8B together.

SCR/diode-string units 20 (FIG. 1) and SCR/diode-string combo units 44 (FIGS. 5A and 5B) have the advantageous features of high turning-on speed, and hence are capable of reducing CDM overshoot. On the other hand, diode-string-free SCR unit 50 (FIG. 8A or 8B) has more SCRs, and hence can provide better ESD protection for high-ESD-current applications. Accordingly, by combining SCR/diode-string units 20 and SCR/diode-string combo units 44 with diode-string-free SCR unit 50, the requirement of reducing CDM overshoot and conducting high ESD current may be satisfied.

FIGS. 9, 10, 11, and 12 illustrate the top views of portions of exemplary ESD protection circuits. It is appreciated that the ESD protection circuits may include more portions repeating the illustrated portions. FIGS. 9, 10, 11, and 12 have different ratios of the number of SCR/diode-string combo units 44 to the number of diode-string-free SCR units 50. The ESD protection circuit in FIG. 9 includes SCR/diode-string combo units 44, and does not include any diode-string-free SCR unit 50. Accordingly the ratio is 1:0. The ESD protection circuit in FIG. 10 includes one SCR/diode-string combo unit 44 corresponding to each diode-string-free SCR unit 50. Accordingly, the ratio is 1:1. The ESD protection circuit in FIG. 11 includes one SCR/diode-string combo units 44 corresponding to every two diode-string-free SCR units 50. Accordingly, the ratio is 1:2. The ESD protection circuit in FIG. 12 includes one SCR/diode-string combo unit 44 corresponding to every three diode-string-free SCR units 50. Accordingly, the ratio is 1:3.

The embodiments of the present disclosure have several advantageous features. The formation of the ESD protection circuit is fully compatible with the manufacturing process for forming Fin Field-Effect Transistors (FinFETs), regardless of the spacing between the semiconductor strips. Furthermore, the trigger voltage and the holding voltage of the ESD protection circuit may be adjusted by changing the number of cascaded diodes in the diode string. Furthermore, the requirements for reducing CDM overshoot and conducting high ESD current may be balanced through adjusting the ratio of the number of SCR/diode-string combo units to the number of diode-string-free SCR units.

In accordance with some embodiments, an ESD protection circuit includes a plurality of groups of p-type heavily doped semiconductor strips (p+ strips) and a plurality of groups of n-type heavily doped semiconductor strips (n+ strips) forming an array having a plurality of rows and columns. In each of the rows and the columns, the plurality of groups of p+ strips and the plurality of groups of n+ strips are allocated in an alternating layout. The ESD protection circuit further includes a plurality of gate stacks, each including a first edge aligned to an edge of a group in the plurality of groups of p+ strips, and a second edge aligned to an edge of a group in the plurality of groups of n+ strips. The ESD protection circuit further includes a conductor electrically connecting a first one of the plurality of groups of p+ strips to a second one of the plurality of groups of n+ strips, wherein the first one and the second one are in a same column.

In accordance with other embodiments, an ESD protection circuit includes a semiconductor substrate of a first conductivity type, and a first well region and a second well region of a second conductivity type opposite to the first conductivity type. The first well region and the second well region are separated from each other by a portion of the semiconductor substrate. A first semiconductor strip extends in a row direction and overlaps and contacts the first well region. The first semiconductor strip includes a first heavily doped portion of the first conductivity type, a second heavily doped portion of the second conductivity type, and a third portion of the second conductivity type connecting the first portion to the second portion. A first gate stack overlaps the third portion of the first semiconductor strip. A second semiconductor strip extends in the row direction and overlaps and contacts the second well region. The second semiconductor strip includes a fourth heavily doped portion of the first conductivity type, a fifth heavily doped portion of the second conductivity type, and a sixth portion of the second conductivity type connecting the fourth portion to the fifth portion. The first and the fifth portions are in a same first column. The second and the fourth portions are in a same second column. A second gate stack overlaps the sixth portion of the second semiconductor strip. A first conductor electrically connects the second portion to the fourth portion. The first and the second gate stacks and the first and the second semiconductor strips are comprised in an SCR/diode-string unit.

In accordance with yet other embodiments, an ESD protection circuit includes a p-type semiconductor substrate, and a diode string including a first, a second, a third, and a fourth diode. The first, the second, the third, and the fourth diodes are aligned sequentially in a column. Each of the first, the second, the third, and the fourth diodes includes a p+ semiconductor strip as an anode, and an n-type semiconductor strip and a n+ semiconductor strip as a cathode. The anodes and the cathodes of the first, the second, the third, and the fourth diodes form an array. In each of rows and columns of the array, the anodes and the cathodes are allocated in an alternating layout. The ESD protection circuit further includes a gate electrode overlaps the n-type semiconductor strip, and four n-well regions, each overlapped by and in contact with one of the first, the second, the third, and the fourth diodes. The four n-well regions are separated from each other by portions of the p-type semiconductor substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a first semiconductor strip in a first well, the first semiconductor strip extending along a first direction in a top-down view, the first semiconductor strip having a first p-doped portion and a first n-doped portion;
a second semiconductor strip in a second well, the second semiconductor strip extending along a second direction parallel to the first direction in the top-down view, the second semiconductor strip having a second p-doped portion and a second n-doped portion, wherein:
the first n-doped portion of the first semiconductor strip is aligned with the second p-doped portion of the second semiconductor strip in the top-down view, and
the first p-doped portion of the first semiconductor strip is aligned with the second n-doped portion of the second semiconductor strip in the top-down view; and
an electrical connection electrically connecting the first n-doped portion to the second p-doped portion, the electrical connection comprising a conductive line, the conductive line having a longitudinal axis perpendicular to the first direction and the second direction in the top-down view.

2. The device of claim 1, further comprising a third well interposed between the first well and the second well, the third well having an opposite conductivity from the first well and the second well.

3. The device of claim 1, wherein the first p-doped portion is electrically coupled to an input/output pad.

4. The device of claim 3, wherein the second p-doped portion is electrically interposed between the second n-doped portion and Vss.

5. The device of claim 1, further comprising a third semiconductor strip in a third well, the third semiconductor strip extending along a third direction parallel to the first direction, the third semiconductor strip having a third p-doped portion and a third n-doped portion, wherein:
the third n-doped portion of the third semiconductor strip is aligned with the first n-doped portion of the first semiconductor strip and the second p-doped portion of the second semiconductor strip in the top-down view, and
the third p-doped portion of the first semiconductor strip is aligned with the first p-doped portion of the first semiconductor strip and the second n-doped portion of the second semiconductor strip in the top-down view.

6. The device of claim 5, wherein each of the first semiconductor strip, the second semiconductor strip, and the third semiconductor strip comprises a diode, wherein a cathode of each of the diodes is between a Vss node and an anode of the each of the diodes.

7. The device of claim 1, wherein the first well and the second well are n-type wells.

8. A device comprising:
a first semiconductor strip in a first well, the first semiconductor strip comprising a first p-n junction;
a second semiconductor strip in a second well, the second semiconductor strip comprising a second p-n junction, the first well and the second well having a same conductivity type;
a first plurality of gate stacks, longitudinal axes of the first plurality of gate stacks being aligned along a first axis, wherein the first p-n junction and the second p-n junction are disposed on opposing sides of the first axis, the first plurality of gate stacks comprising:
a first gate stack over the first semiconductor strip; and
a second gate stack over the second semiconductor strip, the second gate stack being physically separated from the first gate stack; and
a first conductor electrically connecting a first n-doped portion of the first semiconductor strip to a first p-doped portion of the second semiconductor strip.

9. The device of claim 8, further comprising a second conductor electrically coupling a second n-doped portion of the second semiconductor strip to ground.

10. The device of claim 9, wherein the second conductor is electrically coupled to ground through one or more diodes.

11. The device of claim 8, a second plurality of gate stacks, the second plurality of gate stacks comprising:
a third gate stack, the third gate stack extending over the first semiconductor strip, the third gate stack being interposed between a first n-doped portion and a second p-doped portion in the first semiconductor strip, thereby forming a third p-n junction; and
a fourth gate stack, the fourth gate stack extending over the second semiconductor strip, the fourth gate stack being interposed between the first p-doped portion and a second n-doped portion of the second semiconductor strip, thereby forming a fourth p-n junction.

12. The device of claim 8, wherein the first semiconductor strip comprises a first plurality of semiconductor strips.

13. The device of claim 12, wherein the second semiconductor strip comprises a second plurality of semiconductor strips.

14. A device comprising:
a substrate comprising a first doped region, a second doped region, and a third doped region each of a first conductivity type, the first doped region, the second doped region, and the third doped region being disposed in a fourth doped region of a second conductivity type opposite the first conductivity type, a portion of the fourth doped region extending between each of the first doped region, the second doped region, and the third doped region;
a first semiconductor strip over the first doped region and comprising a first p-n junction;
a second semiconductor strip over the second doped region and comprising a second p-n junction;
a third semiconductor strip over the third doped region and comprising a third p-n junction; and
a first electrical connection connecting a fifth doped region of the second semiconductor strip to a sixth doped region of the third semiconductor strip, the fifth doped region being of an opposite conductivity type as the sixth doped region.

15. The device of claim 14, wherein the first semiconductor strip is parallel to the second semiconductor strip.

16. The device of claim 15, wherein the third semiconductor strip is parallel to the second semiconductor strip.

17. The device of claim 16, wherein the first electrical connection is perpendicular to the first semiconductor strip.

18. The device of claim 14, further comprising a gate structure adjacent the first p-n junction.

19. The device of claim 14, wherein the first semiconductor strip comprises a fourth p-n junction, wherein the first p-n junction and the fourth p-n junction share a common n-doped region.

20. The device of claim 14, wherein the first conductivity type is n-type.

\* \* \* \* \*